(12) United States Patent
Xie

(10) Patent No.: US 10,818,856 B2
(45) Date of Patent: Oct. 27, 2020

(54) METHOD FOR FABRICATING THIN FILM TRANSISTOR, METHOD FOR FABRICATING ARRAY SUBSTRATE, AND A DISPLAY APPARATUS

(71) Applicant: Shenzhen China Star Optoelectronics Semiconductor Display Technology Co., Ltd., Shenzhen, Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 59 days.

(21) Appl. No.: 15/576,836

(22) PCT Filed: Jun. 22, 2017

(86) PCT No.: PCT/CN2017/089459
§ 371 (c)(1),
(2) Date: Nov. 26, 2017

(87) PCT Pub. No.: WO2018/209753
PCT Pub. Date: Nov. 22, 2018

(65) Prior Publication Data
US 2018/0337358 A1    Nov. 22, 2018

(30) Foreign Application Priority Data
May 18, 2017 (CN) .......................... 2017 1 0352597

(51) Int. Cl.
*H01L 51/05*    (2006.01)
*H01L 51/00*    (2006.01)
(Continued)

(52) U.S. Cl.
CPC ........ *H01L 51/0566* (2013.01); *G02F 1/1368* (2013.01); *G02F 1/133514* (2013.01);
(Continued)

(58) Field of Classification Search
CPC .............. H01L 51/003; H01L 51/0007; H01L 27/3274; H01L 27/3227; H01L 51/5096;
(Continued)

(56) References Cited

U.S. PATENT DOCUMENTS 7,851,987 B2 * 12/2010 Kane .................. H01L 27/3213
313/498
9,231,222 B2    1/2016 Sung et al.
(Continued)

FOREIGN PATENT DOCUMENTS

CN    102394242 A  *  3/2012
CN    102394242 A     3/2012
(Continued)

OTHER PUBLICATIONS

Xingqiang Liu et al,High mobility amorphous InGaZnO thin film transistor with single wall carbon nanotubes enhanced-current path, Applied Physics Letters, 103(22):223108-223108-4, Nov. 2013.

*Primary Examiner* — Charles D Garber
*Assistant Examiner* — S M Sohel Imtiaz
(74) *Attorney, Agent, or Firm* — Leong C. Lei

(57) ABSTRACT

The present application provides a method for fabricating a thin film transistor, a method for fabricating an array substrate, and a display apparatus. A method for fabricating a thin film transistor including: providing a substrate; covering an isolating layer on the substrate; coating an active layer precursor solution on the isolation layer; forming an active layer thin film by the active layer precursor solution; dividing the active layer thin film into a small module active layer, the mobility of the active layer of the thin film
(Continued)

transistor is increased, and to drive the quantum dot light emitting device of the array substrate through the thin film transistor with high mobility to improve the display luminescence performance of the display apparatus.

3 Claims, 5 Drawing Sheets

(51) Int. Cl.
*H01L 51/50* (2006.01)
*H01L 27/32* (2006.01)
*G02F 1/1368* (2006.01)
*G02F 1/1335* (2006.01)
*H01L 27/28* (2006.01)

(52) U.S. Cl.
CPC ........ *H01L 27/322* (2013.01); *H01L 27/3227* (2013.01); *H01L 27/3274* (2013.01); *H01L 51/001* (2013.01); *H01L 51/003* (2013.01); *H01L 51/0007* (2013.01); *H01L 51/0018* (2013.01); *H01L 51/0023* (2013.01); *H01L 51/0028* (2013.01); *H01L 51/0541* (2013.01); *H01L 51/5056* (2013.01); *H01L 51/5072* (2013.01); *H01L 51/5088* (2013.01); *H01L 51/5096* (2013.01); *G02F 2202/36* (2013.01); *H01L 27/283* (2013.01); *H01L 51/0048* (2013.01); *H01L 51/502* (2013.01); *H01L 2251/301* (2013.01); *H01L 2251/558* (2013.01)

(58) Field of Classification Search
CPC ............. H01L 51/5072; H01L 51/0018; H01L 51/0566; H01L 51/502; H01L 51/508; H01L 51/0028; H01L 27/5096; G02F 1/133514
See application file for complete search history.

(56) References Cited

U.S. PATENT DOCUMENTS

| | | | |
|---|---|---|---|
| 2007/0090422 A1* | 4/2007 | Ishii | H01L 27/124 257/291 |
| 2008/0203895 A1* | 8/2008 | Miller | C09K 11/025 313/498 |
| 2008/0204366 A1* | 8/2008 | Kane | H05B 33/10 345/44 |
| 2008/0218068 A1* | 9/2008 | Cok | H05B 33/145 313/505 |
| 2011/0181817 A1* | 7/2011 | Jung | G02F 1/133516 349/106 |
| 2011/0291071 A1* | 12/2011 | Kim | H01L 51/502 257/13 |
| 2014/0054588 A1* | 2/2014 | Maeda | G02F 1/1368 257/43 |
| 2015/0243849 A1* | 8/2015 | Stroetmann | H01L 29/1606 257/13 |
| 2015/0380653 A1* | 12/2015 | Liu | H01L 51/0036 257/13 |
| 2016/0043152 A1* | 2/2016 | Tian | H01L 29/78684 257/27 |
| 2016/0254467 A1* | 9/2016 | Fong | H01L 51/0541 257/40 |
| 2017/0062749 A1* | 3/2017 | Seo | H01L 51/502 |
| 2017/0162825 A1* | 6/2017 | Xiao | H01L 27/3244 |
| 2017/0219894 A1* | 8/2017 | Cao | G02F 1/133345 |
| 2018/0062101 A1* | 3/2018 | Li | H01L 51/56 |
| 2018/0095289 A1* | 4/2018 | Zhou | H01L 27/326 |
| 2018/0151583 A1* | 5/2018 | Lupino | H01L 27/0688 |
| 2018/0374954 A1* | 12/2018 | Yang | H01L 29/22 |

FOREIGN PATENT DOCUMENTS

| | | |
|---|---|---|
| CN | 102842602 A | 12/2012 |
| CN | 103323975 A | 9/2013 |
| CN | 104299973 A | 1/2015 |
| CN | 105304681 A | 2/2016 |
| CN | 106206972 A | 12/2016 |
| CN | 106444127 A | 2/2017 |

\* cited by examiner

METHOD FOR FABRICATING THIN FILM TRANSISTOR, METHOD FOR FABRICATING ARRAY SUBSTRATE, AND A DISPLAY APPARATUS

FIELD OF THE INVENTION

The present application relates to a display technology field, and more particularly to a method for fabricating thin film transistor, method for fabricating array substrate, and a display apparatus.

BACKGROUND OF THE INVENTION

Quantum dot light emitting device, QLED is a new kind of display apparatus similar to the principle and structure of the organic light emitting display, OLED, that is the quantum dot and organic/inorganic semiconductor are a kind of flat panel display apparatus driven by external direct current electric field and the exciton recombination to emitting light. The quantum dots are adapted as the light emitting layer of QLED having a wider adjustable spectral, higher luminous intensity, higher color purity, longer fluorescence life, better environmental stability than the organic fluorescent dyes, so has a broader development prospect compared with OLED. In recent years, the transparent amorphous oxide semiconductor, TAOS thin film transistors, TFTs have received extensive attention from their potential applications in active matrix light emitting diode displays. The conventional amorphous silicon TFTs cannot meet the current-driven type OLED/QLED display panel due to the low mobility and the severe threshold voltage drift. Although the polysilicon TFTs have higher mobility and better stability, the high temperature process and excessive process steps make the production cost extremely high, and its grain boundary makes the poor uniformity, thus affecting its application in large-size display. TAOS TFTs not only have very low current leakage, but also visible light and transparent, good uniformity, good stability, specifically can be prepared at low temperature, is expected to achieve low-cost of the flexible display. However, the mobility of the oxide TFTs is lower than that of the polycrystalline silicon, so it is of great practical significance to improve the mobility of the oxide thin film transistors.

Because of its excellent and unique electrical and optical properties of the carbon nanotubes, CNTs, in recent years, its application in the electronic devices field is more and more in-depth. Semiconductor single-walled carbon nanotubes, SWCNTs are considered to be one of the most valuable electrical materials due to their excellent mechanical, thermal, electrical properties and chemical stability, which can be used in high-frequency devices to improve the frequency response range of devices. In addition, as the size of conventional Si semiconductor devices keeps decreasing, some unavoidable constraints continue to emerge, such as the short channel effect, the fluctuation of the statistics of the doping concentration in small size cause the uniformity of the quality of the device, and SWCNTs can be used to fabricate the n-type or p-type transistors used in integrated circuits without doping, it is possible to replace silicon-based semiconductors. The mobility of the SWCNTs or nanotube array are basically above 1000 $cm^2/(V.s)$, to meet the requirement of the high mobility of the transistor. Therefore, how to improve the mobility of the thin film transistor, and drive the quantum dot light emitting device through the high mobility thin film transistor to improve the display luminescence performance of the display apparatus has become an urgent problem in the industry.

SUMMARY OF THE INVENTION

The technical problem that the present application mainly solves is to provide a method for fabricating a thin film transistor, a method for fabricating an array substrate and a display apparatus to improve the mobility of the thin film transistor and to drive the quantum dot light emitting device through the high mobility thin film transistor to improve the display luminescence performance.

In order to solve the above-mentioned technical problems, a technical aspect of the present application is to provide a method for fabricating the thin film transistor including the steps of:
  providing a substrate;
  covering an isolating layer on the substrate;
  coating an active layer precursor solution on the isolation layer, the active layer precursor solution formed of a combination of a metal oxide and carbon nanotubes;
  forming an active layer thin film by the active layer precursor solution; and dividing the active layer thin film into a small module active layer.

In order to solve the above-mentioned technical problems, another aspect of the present application is to provide a method for fabricating the array substrate including a method for fabricating the thin film transistor and a method for fabricating a quantum dot light emitting device of each pixel unit:

The method for fabricating the thin film transistor is produced by any of the methods described above.

In order to solve the above-mentioned technical problems, another aspect of the present application is to provide a display apparatus, including an array substrate, a color filter substrate disposed opposite to the array substrate, and a color filter substrate provided on the array substrate and the color filter substrate, wherein the array substrate includes a thin film transistor including a substrate, an isolation layer disposed on the substrate, and an active layer disposed on the isolation layer, the active layer being made of a metal oxide and carbon nanotubes.

The present application has the advantages is that, comparing to the conventional technology, the method for fabricating the thin film transistor, the method for fabricating the array substrate and the display apparatus of the present application are obtained by mixing a single-walled carbon nanotube and a metal oxide as an active layer of a thin film transistor to increase the mobility, and driving the quantum dot light emitting device through the high mobility thin film transistor to improve the display luminescence performance of the display apparatus.

BRIEF DESCRIPTION OF THE DRAWINGS

In order to more clearly illustrate the embodiments of the present application or prior art, the following FIGs will be described in the embodiments are briefly introduced. It is obvious that the drawings are merely some embodiments of the present application, those of ordinary skill in this field can obtain other FIGs according to these FIGs without paying the premise.

DETAILED DESCRIPTION OF PREFERRED EMBODIMENTS

Figure 1:
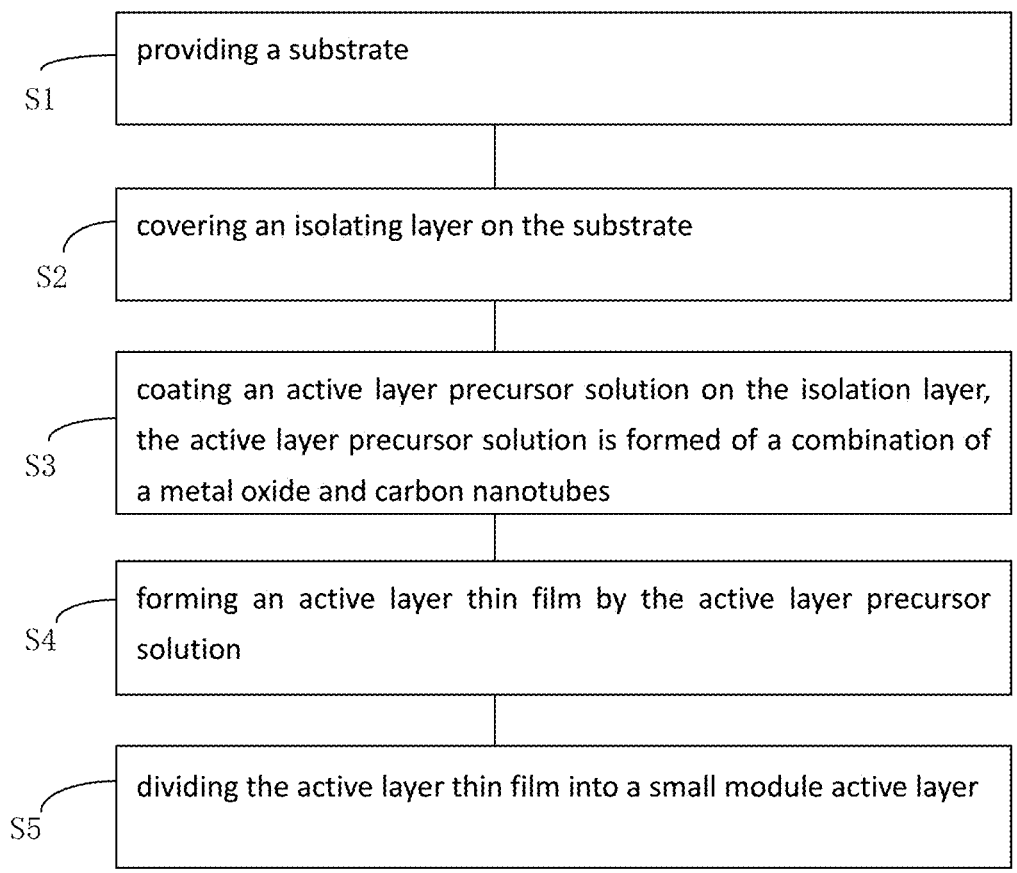
FIG. 1 is a schematic flow diagram of a method for fabricating a thin film transistor of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

In the drawings, the thickness of the layers and regions is exaggerated in order to clarify the device. The same reference numerals denote the same elements throughout the drawings.

It will also be understood that when an element is referred to as being "over" or "upper" on another element, it can be disposed directly on the other element, or an intermediate element can also be present.

Figure 4:
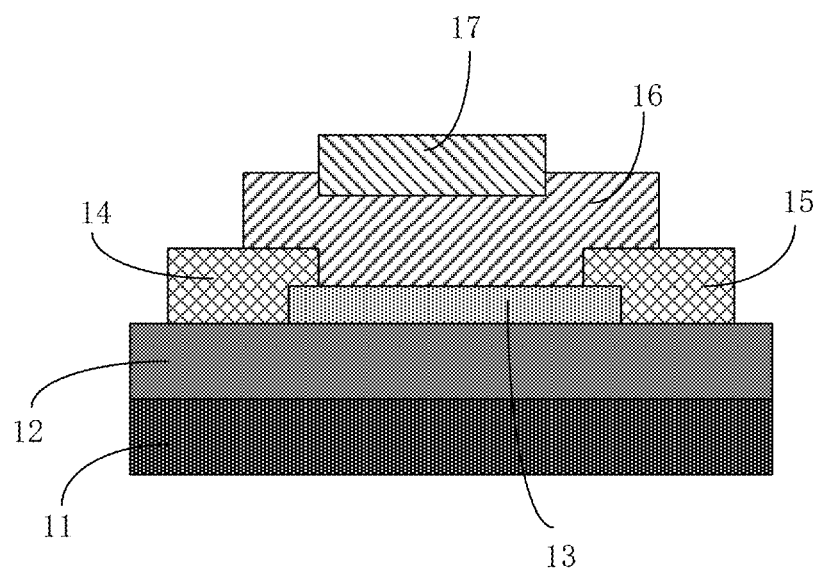
FIG. 4 is a schematic structural view of a thin film transistor of the present application.

Referring to FIGS. 1 and 4, the method for fabricating the thin film transistor of the present application includes the steps of:

Step S1: providing a substrate 11.

Specifically, the substrate 11 can be glass, plastic, quartz or silicon, and the material of the substrate in other embodiments is not limited thereto.

Step S2: covering an isolating layer 12 on the substrate 11.

wherein, the specifically to cover the isolating layer 12 on the substrate 11 is: covering the isolation layer 12 on the substrate 11 by a chemical vapor deposition.

In other embodiments, the material of the isolating layer 12 can be one or a combination of $Al_2O_3$, $HfO_2$, $ZrO_2$, $SiO_2$, $SiN_x$, or an organic compound.

Step S3: coating an active layer precursor solution on the isolation layer 12, and the active layer precursor solution is formed of a combination of a metal oxide and carbon nanotubes.

Figure 2:
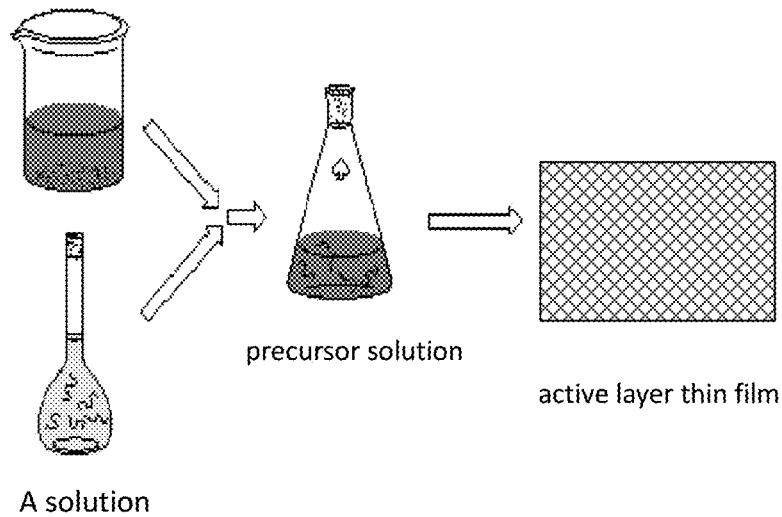
FIG. 2 is a schematic diagram of a precursor solution and an active layer of the present application.

Wherein, referring to FIG. 2, coating the active layer precursor solution on the isolating layer is specifically carried out by adding the single-walled carbon nanotubes to ethylene glycol monomethyl ether to form an A solution with uniform dispersion by ultrasound; dissolving all of the indium chloride, gallium chloride hydrate, zinc chloride and ethanolamine in ethylene glycol monomethyl ether, wherein the ratio of ethanolamine to indium, gallium and zinc is 10:1:1:1, the mixture is stirred at 50° C. for 1 hour in the air environment, and is placed in 24 hours to form a B solution; the A solution is added to the B solution at a different mass ratio of single-walled carbon nanotubes/metal oxides (SW-CNTs/IGZO) and dispersed for 2 hours by ultrasound to form a homogeneous mixed active layer precursor solution.

Wherein the material of the metal oxide can be one or a combination of ZnO, IZO, IGZO, ZTO, HIZO or $In_2O_3$.

Step S4: forming an active layer thin film 13 by the active layer precursor solution.

Figure 3:
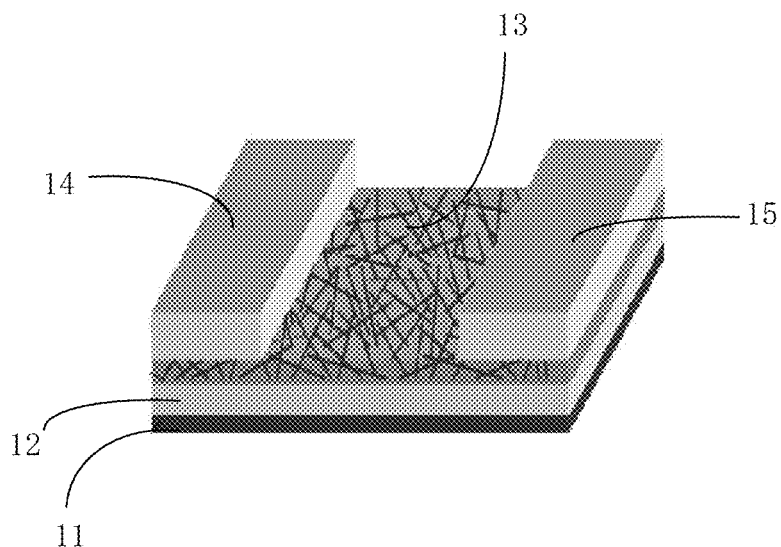
FIG. 3 is a schematic perspective view of the active layer in FIG. 1 in a thin film transistor.

Wherein, referring to FIG. 3, the specifically step of forming an active layer thin film by the active layer precursor solution is: impregnating the substrate 11 covered with the isolation layer 12 with acetone, methanol and isopropanol; the substrate 11 is ultrasonically cleaned and blown dry by high-purity nitrogen; spin-coating the active layer precursor solution onto the isolation layer 12, pre-baking at 80° C. for 5 minutes in air, and followed by heating to 350° C. for 40 minutes, removing the organic solvent and rapidly annealing to obtain an active layer 13 thin film.

Step S5: dividing the active layer 13 thin film into a small module active layer.

Wherein the specifically dividing the active layer 13 thin film into a small module active layer is: coating a photoresist on the active layer 13 thin film; exposing, developing, wet etching the photoresist to divide the active layer 13 thin film into a small module active layer corresponding to each of the thin film transistor.

When the thin film transistor includes a source electrode 14 and a drain electrode 15, the method for fabricating the thin film transistor further includes a process of fabricating the source electrode and the drain electrode, the specifically process is: forming the source electrode 14 and the drain electrode 15 on the isolation layer 12, and the source electrode 14 and the drain electrode 15 are located on both sides of the active layer 13 and are connected to the active layer 13, the specifically is to deposit a metal layer on the isolation layer 12 by physical vapor deposition, applying photoresist on the metal layer, and then exposing, developing, wet etching to form the source electrode 14 and the drain electrode 15.

The thin film transistor further includes a gate electrode 17 and a gate insulating layer 16. The above-mentioned fabricating method further includes a step of forming the gate electrode 17 and the gate insulating layer 16, covering the gate insulating layer 16 on the active layer 13 and the source electrode 14 and the drain electrode 15, specifically, the covering of the gate insulating layer 16 is by chemical vapor deposition.

Forming the gate electrode 17 on the gate insulating layer 16, specifically, a metal layer is deposited on the gate insulating layer 16 by the physical vapor, and a photoresist is applied on the metal layer, then exposing, developing, wet etching to form the gate electrode 17, and the formed thin film transistor at this time is a top gate type thin film transistor.

Wherein the material of the gate electrode 17, the source electrode 14, and the drain electrode 15 can be one or a combination of Mo/Ti, Mo/Cu, Mo/Au, Mo/Al, Cr/Au, Cr/Cu. The material of the gate insulating layer 16 can be one or a combination of $Al_2O_3$, $HfO_2$, $ZrO_2$, $SiO_2$, $SiN_X$ or an organic compound.

When the thin film transistor is a bottom gate type, the specifically structure of the thin film transistor of the bottom gate type is the gate insulating layer above the gate electrode, the active layer above the gate insulating layer, the source electrode and the drain electrode located above the active layer.

It should be noted that, the method for fabricating the thin film transistor further includes a step of forming a passivation layer and forming a contact hole (not shown) on the passivation layer, specifically is covering a passivation layer on the gate insulating layer and the gate electrode, specifically by coating the passivation layer by a chemical vapor deposition, and applying a photoresist on the passivation layer, then exposing, developing, dry etching the passivation layer and the gate insulating layer to form the contact hole corresponding to the region of a drain electrode pattern.

Wherein the material of the passivation layer can be one or a combination of $Al_2O_3$, $HfO_2$, $ZrO_2$, $SiO_2$, $SiN_X$ or an organic compound.

Figure 5:
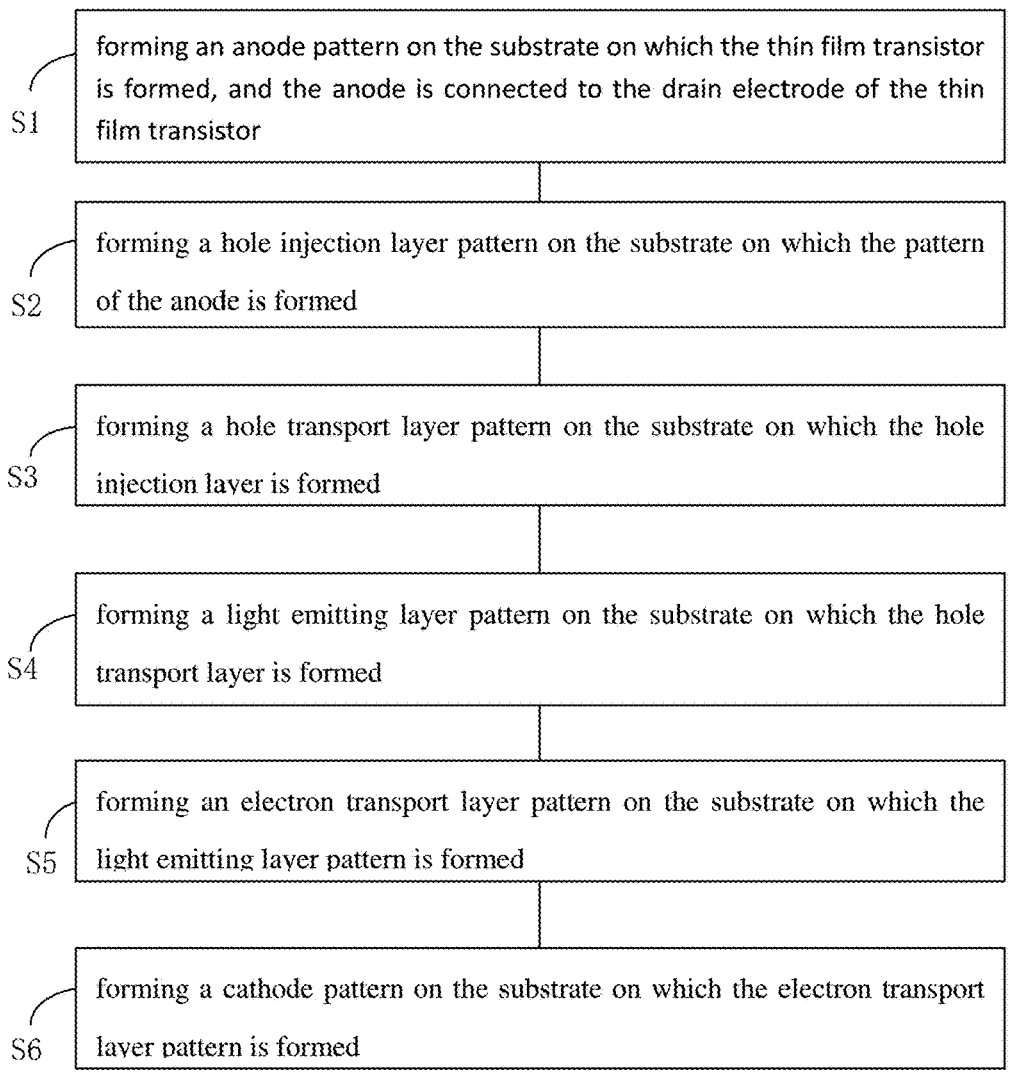
FIG. 5 is a schematic flow diagram of a method for fabricating a quantum dot light emitting device in an array substrate according to the present application.

Referring to FIG. 5, is a schematic flow diagram of a method for fabricating a quantum dot light emitting device in an array substrate according to the present application. Wherein the array substrate is similar to the conventional technology, includes a substrate and a plurality of pixel units arranged in a matrix distributed on the substrate, each of the pixel units includes at least one thin film transistor, the thin film transistor is the thin film transistor provided by the embodiment described above, the array substrate further includes a quantum dot light emitting device located at each of the pixel unit.

Wherein the substrate of the array substrate can be a glass substrate or a flexible substrate. When the substrate is a flexible substrate, the flexible substrate is made of a polymer material such as a polyvinyl alcohol thin film, a polyimide thin film, or a polyester thin film. The method for fabricating the array substrate includes a method for fabricating the thin film transistor in a pixel unit and a method for fabricating the quantum dot light emitting device.

Wherein the method for fabricating the thin film transistor is the method for fabricating the thin film transistor provided in the above embodiment, and the method for fabricating the quantum dot light emitting device will be described in detail below.

Figure 6:
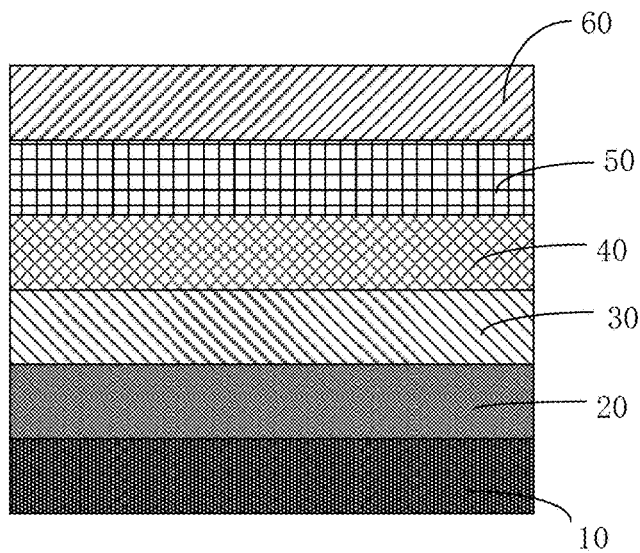
FIG. 6 is a schematic structural view of a quantum dot light emitting device in the array substrate of the present application.
Figure 7:
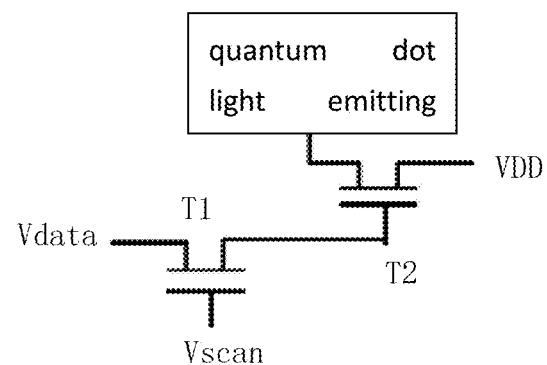
FIG. 7 is a schematic cross-sectional view of the quantum dot light emitting device of FIG. 6.

Referring to FIGS. 6 and 7, a quantum dot light emitting device can be formed on the basis of the thin film transistor provided in the above embodiment, and the method for fabricating the quantum dot light emitting device specifically includes the steps of:

Step S1: forming an anode pattern 10 on the substrate on which the thin film transistor is formed, and the anode 10 is connected to the drain electrode of the thin film transistor. The specifically to form the anode pattern on the substrate on which the thin film transistor is: forming a transparent conductive film by sputtering on the substrate on which the thin film transistor is formed, and forming a transparent pixel anode by photolithography and wet etching to form a transparent pixel anode by isolating the transparent conductive film pattern corresponding to each thin film transistor. And then ultrasound washing by deionized water, acetone and isopropanol for 15 minutes, dried at 100° C. and treated with an ultraviolet ozone machine for 30 minutes to clean and improve the hydrophilicity of the surface of the transparent conductive film.

Wherein the material of the anode 10 can be one or a combination of doped graphene, metal film (Al, Ag, Pt, Au, etc.), oxide (ITO, AZO, CTO, etc.), composite film ($TiO_2$-$Ag$-$TiO_2$, $SiO_2$-$Au$-$ZrO_2$, etc.), transparent conductive polymer (polyaniline, etc.)

Step S2: forming a hole injection layer 20 pattern on the substrate on which the pattern of the anode 10 is formed.

The specifically of forming the hole injection layer pattern on the substrate on which the anode 10 pattern is formed includes spin-coating the aqueous dispersion solution of poly-3,4-vinyl dioxythiophene and polystyrene sulfonate on the substrate having an anode 10 pattern for 60 seconds at a rotational speed of 3000 revolutions per minute, heating in a glove box at 200° C. for 10 minutes to remove aqueous and thermally cross-linked to obtain a hole injection layer 20.

Wherein the material of the hole injection layer 20 can be one or a combination of PEDOT (PSS), 2T-NATA, or m-MTDATA.

Step S3: forming a hole transport layer 30 pattern on the substrate on which the hole injection layer 20 pattern is formed.

The specifically of forming the hole transport layer pattern on the substrate on which the hole injection layer pattern is formed includes spin-coating a solution of the polymer triphenyl diamine derivative on the hole injection layer 20 to form the hole transport layer 30.

Wherein the material of the hole transport layer 30 can be one or a combination of TFB, PVK, CBP, NPB or Poly-TPD.

Step S4: forming a light emitting layer 40 pattern on the substrate on which the hole transport layer 30 pattern is formed.

The specifically of forming the light emitting layer pattern on the substrate on which the hole transport layer pattern is formed includes spin-coating quantum dot of CdSe/ZnS dissolved in toluene on the hole transport layer 30 at a rotational speed of 2000 revolutions per minute for 20 seconds to form a quantum dot light emitting layer, and dried in a vacuum oven at 150° C. for 10 minutes to form a light emitting layer 40 pattern.

Wherein the material of the light emitting layer 40 can be one or a combination of carbon quantum dot, graphene quantum dot, cadmium-based quantum dot (CdSn/ZnS, CdTe, etc.), cadmium-free quantum dot (InP, perovskite quantum dot, etc.) or silicon quantum dot.

Step S5: forming an electron transport layer 50 pattern on the substrate on which the light emitting layer 40 pattern is formed.

The specifically of forming the electron transport layer pattern on the substrate on which the light emitting layer pattern is formed includes placing the substrate on which the light emitting layer 40 is formed in a vapor deposition machine, thermally depositing a layer of a hole blocking layer having a thickness of 40 nm to form the electron transport layer 50.

Wherein the material of the electron transport layer 50 can be one or a combination of TPBi, BBOT, BCP, Alq3 or BND.

Step S6: forming a cathode 60 pattern on the substrate on which the electron transport layer 50 pattern is formed.

The specifically of forming the cathode pattern on the substrate on which the electron transport layer pattern is formed includes covering a metal mask, depositing aluminum on the substrate on which the electron transport layer 50 is formed by a vacuum deposition method to obtain a lattice pattern to form a cathode 60. The cathode 60 is connected to the cathode grounded power source (not shown) via a through hole (not shown) to form an electric field with the anode to drive the light emitting layer to emit light.

Wherein the material of the cathode 60 can be one or a combination of doped graphene, single layer metal (Al, Ag, Mg, etc.), alloy (Mg:Ag, Li:Al, etc.) or a double layer (thin insulating layer plus metal, such as LiF, MgO, $Al_2O_3$ plus Al, etc.).

It should be noted that, the method for fabricating the quantum dot light emitting device can further include a method of forming a peripheral protective layer on the cathode 60 covering the entire substrate, for example, by coating a layer of resin by a resin coating technique, and then performing a patterning process to form the peripheral protective layer on the corresponding region to prevent damaging to the pixel electrode and/or the light emitting organic matter by the air, moisture and other impurities.

In addition, the method for fabricating the thin film transistor provided in the embodiment of the present application, each film layer is formed mainly by sputtering or coating, and the patterning process, the process flow is simple and the requirements for the equipment are low, and the equipment for preparing the amorphous silicon thin film transistor can be adapted to fabricate the thin film transistor having a higher carrier mobility, the production cost of the product can be reduced.

The patterning process in the present application can only include a photolithographic process or include a photolithographic process and an etching step, and can also include other processes for forming a predetermined pattern, such as printing, inkjet, etc., photolithography process refers to using photoresist, mask plate, exposing machine and other processes to form patterns during the processes of film forming, exposing, developing and other processes. The corresponding patterning process can be selected according to the structure formed in the present application.

Figure 8:
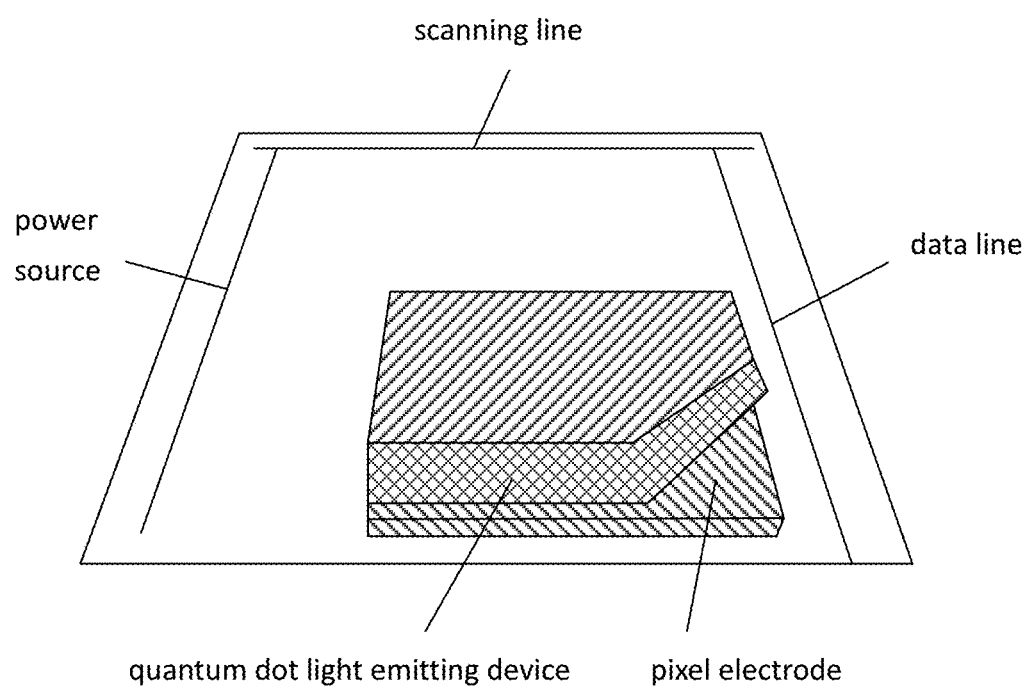
FIG. 8 is a schematic diagram of the driving circuit of the quantum dot light emitting device of FIG. 6.

Referring to FIG. 8, the driving circuit of the quantum dot light emitting device includes a first controllable switch T1, a second controllable switch T2, and a quantum dot light emitting device. Wherein, a control terminal of the first controllable switch T1 receives a scanning signal Vscan from the scanning line of the scanning driving circuit, and a first terminal of the first controllable switch T1 receives a data signal Vdata from the data line, a second terminal of the first controllable switch T1 is connected to a control terminal of the second controllable switch T2, a first terminal of the second controllable switch T2 is connected to the anode 10 of the quantum dot light emitting device, a second terminal of the second controllable switch T2 receives a voltage signal VDD. Wherein the first controllable switch Ti and the second controllable switch T2 are N-type thin film transistors, the control terminals, the first terminals and the second terminals of the first and second controllable switches respectively correspond to the gate electrodes, the drain electrodes and source electrodes of the N-type thin film transistors.

When the scanning signal Vscan is at a high level, the first controllable switch T1 is turned on, the high level of the data signal Vdata is provided to the control terminal of the second controllable switch T2, the second controllable switch T2 is turned on, the voltage signal VDD supplies a voltage to the quantum dot light emitting device to make it emitting light.

Figure 9:
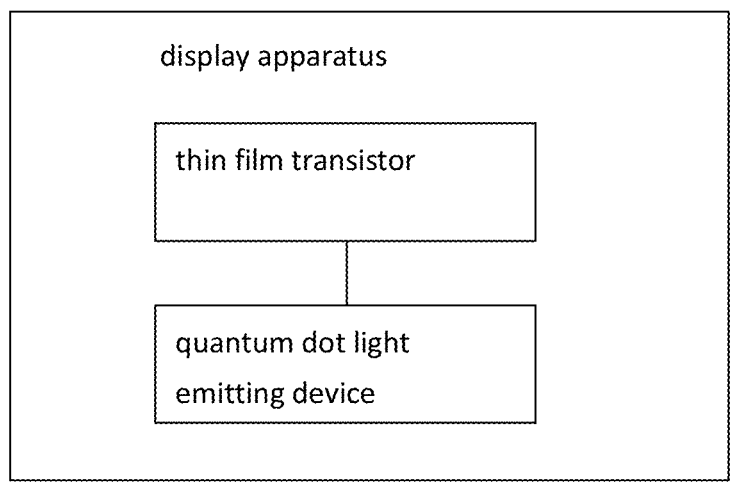
FIG. 9 is a schematic structural view of a display apparatus according to the present application.

Referring to FIG. 9, is a schematic structural view of the display apparatus of the present application. The display apparatus includes the above-described array substrate, a color filter substrate disposed opposite to the array substrate, and a liquid crystal disposed between the array substrate and the color filter substrate, other devices and the functions of the display apparatus are the same with the devices and functions of the display apparatus in the current technology, and will not be described here.

The method for fabricating the thin film transistor and the method for fabricating the array substrate increase the mobility by mixing the single-walled carbon nanotube and the metal oxide as the active layer of the thin film transistor and driving the quantum dot light emitting device through the high mobility thin film transistor to improve the luminous performance of the display.

Above are embodiments of the present application, which does not limit the scope of the present application. Any modifications, equivalent replacements or improvements within the spirit and principles of the embodiment described above should be covered by the protected scope of the invention.

What is claimed is:

1. A method for fabricating a thin film transistor comprises the following steps:
   providing a substrate;
   covering an isolating layer on the substrate;
   coating an active layer precursor solution on the isolation layer, the active layer precursor solution is formed of a combination of a metal oxide and carbon nanotubes;
   forming an active layer thin film by the active layer precursor solution; and
   dividing the active layer thin film into a small module active layer wherein the method further comprises:
   fabricating a source electrode and a drain electrode on the isolation layer, and
   the source electrode and the drain electrode are connected to the active layer, specifically to deposit a metal layer on the isolation layer by physical vapor deposition,
   applying photoresist on the metal layer, and then exposing, developing, and wet etching to form the source electrode and the drain electrode;
   covering a gate insulating layeron the active layer, the source electrode and the drain electrode, the covering of the gate insulating layer is specifically by chemical vapor deposition,
   forming a gate electrode on the gate insulating layer, specifically depositing metal layer on the gate insulating layer by physical vapor method, and applying a photoresist on the metal layer, then exposing, developing, and wet etching to form the gate electrode;
   covering a passivation layer on the gate insulating layer and the gate electrode, specifically coating the passivation layer by a chemical vapor deposition method; and
   forming a contact hole, specifically applying a photoresist on the passivation layer, then exposing, developing, and dry etching to form the contact hole;
   wherein the step of coating an active layer precursor solution on the isolation layer, the active layer precursor solution is formed of a combination of a metal oxide and carbon nanotubes comprising:
   adding a single-walled carbon nanotubes to ethylene glycol monomethyl ether to form an A solution with uniform dispersion by ultrasound;
   dissolving all of the indium chloride, gallium chloride hydrate, zinc chloride and ethanolamine in ethylene glycol monomethyl ether,
   wherein the ratio of ethanolamine to indium, gallium and zinc is 10:1:1:1, the mixture is stirred at 50° C. for 1 hour in the air environment, and is placed for 24 hours to form a B solution; and
   mixing the A solution and the B solution at a different mass ratio, and dispersed for 2 hours by ultrasound to form a homogeneous mixed active layer precursor solution.

2. The method for fabricating a thin film transistor according to claim 1, wherein the step of forming an active layer thin film by the active layer precursor solution comprising:

impregnating the substrate covered with the isolation layer with acetone, methanol and isopropanol;

ultrasonically cleaning the substrate and blown dry by high-purity nitrogen; and spin-coating the active layer precursor solution onto the isolation layer, pre-baking at 80° C. for 5 minutes in air, and followed by heating to 350° C. for 40 minutes, removing the organic solvent and rapidly annealing to obtain an active layer thin film;

dividing the active layer thin film into a small module active layer comprising:

coating a photoresist on the active layer thin film; and exposing, developing, wet etching the photoresist to divide the active layer thin film into a small module active layer corresponding to each of the thin film transistor.

3. A method for fabricating an array substrate, wherein the method comprises a method for fabricating the thin film transistor in each pixel unit and a method for fabricating a quantum dot light emitting device;

wherein the method for fabricating the thin film transistor is according to the method recited in claim 1;

wherein the method for fabricating the quantum dot light emitting device comprises:

forming an anode pattern on the substrate on which the thin film transistor is formed, and the anode is connected to the drain electrode of the thin film transistor;

forming a hole injection layer pattern on the substrate on which the pattern of the anode is formed;

forming a hole transport layer pattern on the substrate on which the hole injection layer pattern is formed;

forming a light emitting layer pattern on the substrate on which the hole transport layer pattern is formed;

forming an electron transport layer pattern on the substrate on which the light emitting layer pattern is formed; and forming a cathode pattern on the substrate on which the electron transport layer pattern is formed;

wherein the step of forming the anode pattern on the substrate on which the thin film transistor comprising:

forming a transparent conductive film by sputtering on the substrate on which the thin film transistor is formed, and forming a transparent pixel anode by photolithography and wet etching by isolating the transparent conductive film pattern corresponding to each thin film transistor; and ultrasound washing by deionized water, acetone and isopropanol for 15 minutes, dried at 100° C. and treated with an ultraviolet ozone machine for 30 minutes to clean and improve the hydrophilicity of the surface of the transparent conductive film;

the step of forming the hole injection layer pattern on the substrate on which the anode pattern is formed comprising:

spin-coating the aqueous dispersion solution of poly-3,4-vinyl dioxythiophene and polystyrene sulfonate on the substrate having an anode pattern for 60 seconds at a rotational speed of 3000 revolutions per minute, heating in a glove box at 200° C. for 10 minutes to remove aqueous and thermally cross-linked to obtain a hole injection layer;

the step of forming the hole transport layer pattern on the substrate on which the hole injection layer pattern is formed comprising:

spin-coating a solution of the polymer triphenyl diamine derivative on the hole injection layer to form the hole transport layer;

the step of forming the light emitting layer pattern on the substrate on which the hole transport layer pattern is formed comprising:

spin-coating quantum dot of CdSe/ZnS dissolved in toluene on the hole transport layer at a rotational speed of 2000 revolutions per minute for 20 seconds to form a quantum dot light emitting layer, and dried in a vacuum oven at 150° C. for 10 minutes to form a light emitting layer pattern;

the step of forming the electron transport layer pattern on the substrate on which the light emitting layer pattern is formed comprising:

placing the substrate on which the light emitting layer is formed in a vapor deposition machine, thermally depositing a layer of a hole blocking layer having a thickness of 40 nm to form the electron transport layer; and the step of forming the cathode pattern on the substrate on which the electron transport layer pattern is formed comprising:

covering a metal mask, depositing aluminum on the substrate on which the electron transport layer is formed by a vacuum deposition method to obtain a lattice pattern to form a cathode.

* * * * *